SEMICONDUCTOR DEVICE

Filed Aug. 27, 1954

INVENTORS:
WILLIAM R. CADY,
JOHN E. MULHERN JR.,
BY Julius J. Zaskalicky
THEIR ATTORNEY.

United States Patent Office 2,814,735

Patented Nov. 26, 1957

2,814,735

SEMICONDUCTOR DEVICE

William R. Cady, North Syracuse, and John E. Mulhern, Jr., East Syracuse, N. Y., assignors to General Electric Company, a corporation of New York Application August 27, 1954, Serial No. 452,652

2 Claims. (Cl. 307—88.5)

This invention relates to semiconductor devices, and more particularly, to such devices utilized for rectifying alternating voltages.

Semiconductor rectifying devices of the point-contact and junction types are well known in the art. Another type of semiconductor rectifier of older origin but still in use, is the surface-barrier type wherein surface contact phenomena are relied upon for rectification.

The present invention is principally directed to a junction rectifier wherein a body of semiconductor material contains zones of opposite conductivity type meeting at a P–N junction, and will be described in conjunction therewith. However, the invention is broader in scope and is applicable to other kinds of rectifiers.

Prior art junction rectifiers suffer from the serious disadvantage of a rapid decrease in rectification efficiency as the frequency of the impressed signal is increased. The term rectification efficiency denotes the ratio of the forward current to back current, as those terms are normally used in the rectifier art. If a rectifier is to find any large scale utilization it is necessary that it have a good rectification efficiency at high frequencies.

Accordingly, it is a principal object of the present invention to provide a junction semiconductor device having improved high frequency response.

Another object of the present invention is to provide an improved semiconductor rectifier.

In accordance with a principal feature of the present invention a body of semiconductor material having zones of opposite conductivity type meeting at a P–N junction is provided with diode contacts positioned to enable an alternating voltage to be applied across the P–N junction to rectify one alternation thereof. A source of voltage is connected to the semiconductor body to establish an electric field in the body having a component transverse to the direction of the flow of holes established by the alternating voltage, thereby preventing the return of carriers to the junction during the non-conductive alternations, and thus increasing the high frequency response of the rectifier.

Figure 1:
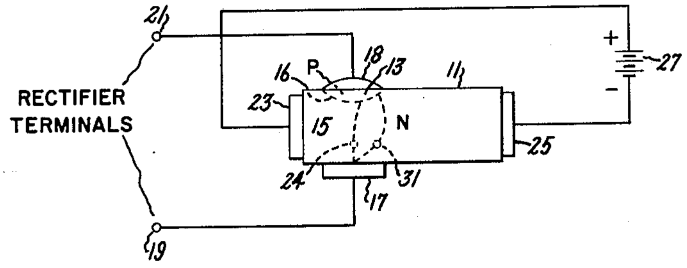
Figure 2:
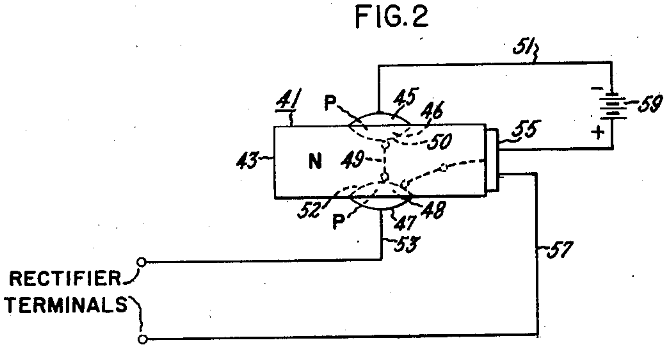

The features of this invention which are believed to be novel are set forth with particularity in the appended claims. The invention itself, however, both as to its organization and method of operation, together with further objects and advantages thereof, may best be understood by reference to the following description when taken in connection with the accompanying drawing wherein:

Fig. 1 is a cross-sectional view of one embodiment of the present invention and schematically shows a biasing circuit therefor, and Fig. 2 is a cross-sectional view of a second embodiment of the present invention with a circuit therefor schematically shown.

Referring now to Fig. 1, an exemplary embodiment of the present invention is therein depicted comprising a body of semiconductor material 11 having opposite conductivity type zones 13 and 15 meeting at a P–N junction indicated at 16. An ohmic contact 17 is made to zone 15 of the body 11 and a terminal lead 19 is attached thereto. An ohmic contact 18 is made to zone 13 and terminal lead 21 is connected to the contact 18. As is well known, a P–N junction enables the passage of current therethrough only when biased in the forward direction and substantially prevents the passage of current therethrough when biased in the reverse direction. A P–N junction is biased in the forward direction when the P-type material is biased positively with respect to the N-type material and is biased in the reverse direction when the P-type material is biased negatively with respect to the N-type material. Accordingly, the device included between terminals 19 and 21 is a unilateral conducting device and rectifies an alternating voltage. When an alternating voltage biases P-type zone 13 positive with respect to N-type zone 15, current flows through the junction 16 in the form of positive carriers termed holes. When the alternating voltage biases P-type zone 13 negatively with respect to N-type zone 15, substantially no current flows through the junction 16 because the positive carriers in the P-type zone are attracted toward terminal 21 and the negative carriers, or electrons, in N-type zone 15 are attracted toward contact 17, thereby removing carriers from the vicinity of the junction 16 and creating a barrier. When the impressed voltage begins a negative alternation, there are holes left in the zone 15 that were caused to flow by the preceding positive alternation. These holes which remain in the N-type region and which have not had time to be removed, diffuse toward terminal 21 during the negative half-cycle and normally flow back through the junction 16 thereto. Such a reverse flow of carriers results in a reverse current flow during a portion of the negative alternation, and hence causes a reduction in rectification efficiency. At low frequencies, such reverse current is negligible because the small number of carriers that are not removed and that do not flow in the reverse direction are averaged out over the relatively long period of time of the negative alternation, thereby giving a small average current.

However, at high frequencies, the undesirable reverse current effect is greatly exaggerated and causes a serious loss of rectification efficiency, and at very high frequencies, results in practically no rectifying action. This occurs because the negative alternation is of relatively short duration; thus, a higher average reverse current flows across the junction because the period of time for averaging the carrier flow is smaller.

In accordance with the principles of the present invention, a pair of ohmic contacts 23 and 25 are attached to the ends of the body of semiconductor material 11 and a direct voltage source 27 is connected therebetween to establish an electric field in the body of semiconductor material 11. The contacts 23 and 25 are positioned so that the field established by the source 27 has a component in a transverse direction to the flow of carriers from zone 13 to contact 17. When a hole enters the zone 15 from the zone 13, instead of traveling the path indicated at 24, the hole travels the path indicated at 31. Further, when the alternating voltage applied between terminals 19 and 21 reverses and zone 13 becomes negative with respect to zone 15, the hole indicated at 31 does not return to the junction 16 because the field established by the source 27 is sufficient to keep the hole away from the junction; hence, the hole does not recross the junction 16 and contribute to the reverse current thereby substantially increasing the rectification efficiency at high frequencies. A bias source of several voltages proved quite satisfactory in substantially increasing the rectification efficiency at high frequencies.

Another embodiment of the present invention is illustrated in Fig. 2. A junction transistor designated 41 is utilized as a high frequency rectifier. The transistor 41 is not, per se, a part of the present invention. The transistor 41 may be constructed, for example, as described in a copending application of W. C. Dunlap, Jr., Serial Number 187,490, filed September 29, 1950, and assigned to the assignee of the present invention.

The transistor 41 comprises a base wafer 43 having activator dots 45 and 47 positioned thereon. A portion of the activator material is diffused into the base wafer 43 to form two P-type zones 46 and 48 separated by an N-type zone 49. Contacts 51 and 53 are connected to the dots 45 and 47, respectively. An ohmic contact 55 is made to the base wafer 43.

In accordance with the principles of the present invention, contact 53 and a lead 57 attached to the base contact 55 are utilized as rectifier terminals, and a source of direct voltage 59 is connected between contact 51 and base contact 55, with the positive terminal of the source 59 connected to the contact 55.

In operation, an alternating voltage to be rectified is impressed between terminals 53 and 57. During a positive alternation, P-type region 48 is positive with respect to N-type region 49, and hence holes flow across junction 52. The major portion of the holes travel through junction 50 to terminal 51 and return to terminal 57 through source 59 since the distance between junction 52 and 50 is considerably less than the spacing between junction 52 and contact 55. A small number of holes travel to terminal 57 directly through the N-type zone 49. During a succeeding negative alternation, the P-type zone 48 is biased negatively with respect to the N-type zone 49 and hence, substantially no current flows through the junction 52. The junction 50 is permanently biased in the reverse direction by the source 59. Thus, the holes remaining in the N-type zone 49 during the negative alternation diffuse across junctions 50 and 52 to terminals 51 and 53 since these terminals are both negative with respect to N-type zone 49. The holes, which are positive in electrical characteristic, are therefore swept out of the zone 49, with a portion of the holes recrossing junction 52 and flowing out of terminal 53, the remaining portion of the holes crossing junction 50 and flowing through terminal 51. The proportion of the holes flowing to terminal 51 with respect to the holes flowing to terminal 53 is controlled by the magnitude of the voltage of source 59, among other things.

For rectification purposes, the flow of holes back across junction 52 to terminal 53 is undesirable, since this contributes to the reverse current of the diode. Hence, the use of the additional junction 50 greatly increases the rectification efficiency of the diode, because without such additional junction, all of the holes would have recrossed junction 52 and added to the reverse current. By the employment of the principles of the present invention, a substantial number of the holes are caused to diffuse across junction 50 by the action of source 59 and hence, do not contribute to the reverse current.

While specific embodiments have been shown and described, it will of course be understood that various modifications may yet be devised by those skilled in the art which will embody the principles of the present invention and found in the true spirit and scope thereof.

What is claimed is:

1. A unilaterally conducting semiconductor device for rectifying alternating voltages comprising a body of semiconductor material having first and second zones of opposite conductivity type semiconductor material meeting at a P–N junction, a first ohmic contact to said first zone, a second ohmic contact to said second zone, said first and second contacts being arranged as diode terminals, third and fourth ohmic contacts to said second zone positioned to enable an electric field to be established in said second zone having a component in a direction transverse to the direction of carrier flow between said first and second terminals, said third ohmic contact being positioned adjacent to said junction and said fourth contact being positioned remote from said junction, biasing means connected between said third and fourth terminals and so polarized as to establish an electric field therebetween to move conduction carriers toward said remote contact.

2. A unilateral semiconductor device comprising a bar of semiconductor material having zones of opposite conductivity type semiconductor material meeting at a P–N junction located substantially perpendicular to the ends of said bar, first and second contacts connected to said bar of semiconductor material on opposite sides of said P–N junction to enable an alternating voltage to be applied thereto, third and fourth ohmic contacts connected to said bar at said ends thereof, said third contact being adjacent to said junction and said fourth contact being remote from said junction, said third and fourth contacts being positioned to enable an electric field to be established in said bar having a component parallel to said junction, and a source of direct voltage connected between said third and fourth contacts in a polarity as to cause conduction carriers in said bar to move toward said fourth contact.

References Cited in the file of this patent

UNITED STATES PATENTS

| | | |
|---|---|---|
| 2,524,033 | Bardeen | Oct. 3, 1950 |
| 2,561,411 | Pfann | July 24, 1951 |
| 2,597,028 | Pfann | May 20, 1952 |
| 2,666,814 | Shockley | Jan. 19, 1954 |
| 2,695,930 | Wallace | Nov. 30, 1954 |
| 2,736,822 | Dunlap | Feb. 28, 1956 |
| 2,769,926 | Lesk | Nov. 6, 1956 |